United States Patent [19]

Vinal

[11] Patent Number: 4,982,254

[45] Date of Patent: Jan. 1, 1991

[54] DIFFERENTIALLY MAGNETICALLY SENSITIVE DIODE STRUCTURE

[75] Inventor: Albert W. Vinal, Cary, N.C.

[73] Assignee: International Business Machines Corp., Armonk, N.Y.

[21] Appl. No.: 867,909

[22] Filed: May 21, 1986

Related U.S. Application Data

[63] Continuation of Ser. No. 388,773, Jun. 15, 1982, abandoned.

[51] Int. Cl.$^5$ .......................................... H01L 43/06
[52] U.S. Cl. ..................................................... 357/27
[58] Field of Search ........................................... 357/27

[56] References Cited

U.S. PATENT DOCUMENTS 3,305,790 2/1967 Parsons et al. ...................... 357/27
4,654,684 3/1987 Vinal ................................... 357/27

Primary Examiner—William D. Larkins
Attorney, Agent, or Firm—Edward H. Duffield

[57] ABSTRACT

A three terminal differentially sensitive magnetic diode structure is described. It offers high magnetic sensitivity and utilizes the Lorentz field potential modulation of injected carriers at the emitter. Two base contacts separated from the emitter are employed to derive a signal from the modulation of emitter injection in the presence of a magnetic field.

3 Claims, 1 Drawing Sheet

DIFFERENTIALLY MAGNETICALLY SENSITIVE DIODE STRUCTURE

This is a continuation of co-pending application Ser. No. 388773 filed on June 15, 1982, now abandoned.

RELATED APPLICATIONS

This application describes a diode structure utilizing some principles similar to that in my copending application Ser. No. 253,128 dealing with magnetically sensitive transistors.

PRIOR ART

A number of magnetically sensitive transistor structures have been previously described in the prior art. Examples are U.S. Pat. Nos. 3,389,230, 3,533,159 or 3,692,595. Other similar art is also known but does not differ greatly from these patents. The general description that fits these prior art devices is that an elongated emitter is centrally located between two laterally spaced elongated collectors, with major portions of the collectors being on opposite sides of the emitter and some portions below and parallel to it.

A chief difficulty with the known prior art lies in the fact that these transistor devices presume the magnetic transduction mechanism to be the deflection of electrons or of injected carriers by a magnetic field. According to this belief, the carriers are diverted to and collected more heavily at one collector than the other. The structure using the deflection theory employs an elongated emitter with two parallelly spaced collectors straddling the emitter on each side. This makes the long axis of the emitter and the collectors parallel with the magnetic field vector to which the device is sensitive. In adopting such a configuration, the developers thereof failed to recognize or utilize the newly discovered transduction mechanisms first described in my above-mentioned copending patent application.

Magnetically sensitive transistors, including my own devices mentioned above, also require contacts for the collectors and the added complication of constructing collector members themselves. To simplify the design and eliminate sources of signal-reducing carrier recombination, etc., it would be greatly desirable to simplify structures further and yet achieve a magnetically sensitive device. A minimum of components or elements in the structure also should enhance the yield of the manufacturing processes employed.

OBJECTS OF THE INVENTION

In view of the known difficulties with the prior art, an object of the present invention is to provide an improved magnetically sensitive diode structure requiring only an emitter and two base contacts to take advantage of the Lorentz field modulation of emitter carrier injection A further object of the present invention is to provide an improved differentially magnetically sensitive diode structure.

Still a further object of the present invention is to provide an improved magnetically sensitive diode structure with means for limiting or controlling the dominant area of carrier injection from the emitter surfaces to a specified smaller portion of the total emitter base junction area.

SUMMARY

As described below, the foregoing objects of the present invention are met by providing a magnetically sensitive differential diode structure having a single emitter, a common base and two separated base contacts Preferably, the dominant area of injection from the emitter is limited to one surface of the emitter diffusion in its substrate. Also the location of the base contacts relative to the emitter is important. The emitter lies between the two base contacts with the contacts for the base being on opposite sides of an imaginary plane bisecting the dominant area of injection on the emitter surface. The imaginary plane so constructed should pass through the null point in the minimum Lorentz field potential contour developed across the injecting face of the emitter surface.

The invention will be further described with reference to a typical preferred embodiment and illustrative drawings as follows:

DETAILED SPECIFICATION

As has been previously described in my aforementioned copending application, a new primary transduction mechanism has been identified that is responsible for the magnetic sensitivity of a variety of magnetic transistors. It was previously unknown, however, that the same mechanism could be made operative in diode structures. It has been discovered that by utilizing relatively longer base lengths and controlling emitter injection to occur preferentially from a single surface of the emitter, one can achieve operative differentially sensitive diodes. The transduction mechanism has been identified as Lorentz field induced modulation of injection of carriers at the emitter. Simply put, I now call this Lorentz modulation of injection.

Figure 1:
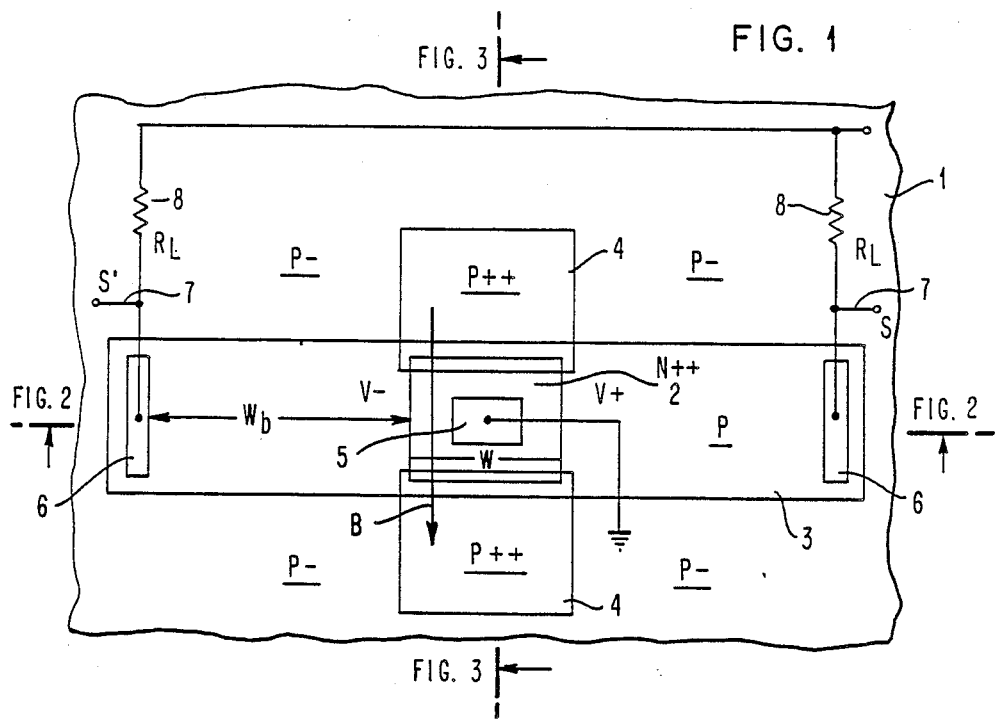
FIG. 1 illustrates a schematic plan view of a preferred embodiment of a differentially sensitive magnetic diode constructed in accordance with the principles of the present invention and showing schematically its mode of employment for sensing an output signal.

Turning to FIG. 1, a structure of a typical differentially sensitive magnetic diode of the preferred form of the present invention is shown. It should be understood that the substrate 1 in FIG. 1 is a silicon wafer or chip and that the plan view of the elements in FIG. 1 omits depicting the surrounding material except by the usage of the P- symbols showing the generally surrounding substrate area to be a lightly doped P type substrate material An emitter 2 of heavily N type doped material is shown centrally located in an elongated base 3 comprising P type material more heavily doped than the surrounding substrate. Very heavily doped P type injection suppressor areas 4 form boundaries to the side of the emitter 2 to inhibit injection into the substrate there and enhance injection from the bottom of the emitter 2. A contact 5 is shown for the emitter 2 and is depicted as simply a rectangular area, it being understood that an overlying layer of silicon dioxide insulator and metallic contact have been omitted in FIG. 1 for clarity. Base contact areas 6 are also shown at either end of the elongated common region 3. These are not implants, but are merely areas to which ohmic contact with the surface of the semiconductive material substrate may be made. Signal leads 7 and load resistances 8 are used to derive the output signal $V_{bb}$ which is the base to base output voltage relative to ground. The emitter 2 is grounded through its contact 5 as schematically shown.

Figure 2:
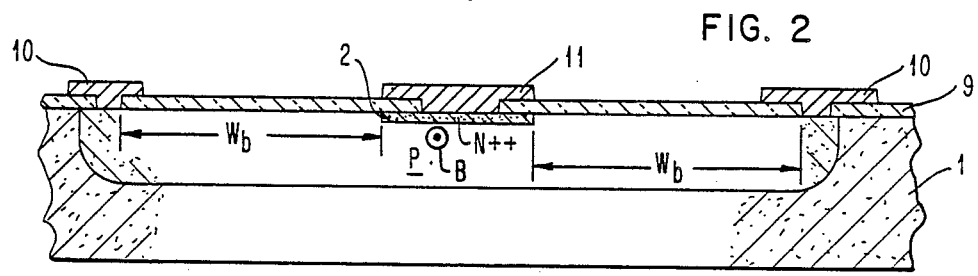
FIG. 2 is a cross-sectional view taken longitudinally through the conducting base of the differential diode structure shown in FIG. 1.

In FIG. 2, a horizontal elevational cross section taken along line AA in FIG. 1 is illustrated. The substrate 1 is now shown with an overlying silicon dioxide layer 9 and with metallic base contacts 10 and a metallic emitter contact 11 included. Due to the location of the sectional line in FIG. 1, the heavily doped P+ suppressor pockets 4 do not appear in FIG. 2. The length of the base region 3 is measured from the edges of the emitter 2 and is depicted as $W_b$ as shown in FIG. 2. The base region 3 comprises a pocket of implanted heavily doped P type material diffused or implanted into the surface of the substrate 1 using well known techniques. The emitter 2 is an N type heavily doped implanted region to which ohmic contact by contact 11 is made as shown. Injection from the emitter 2 will be primarily in the direction vertically out the bottom surface of the emitter 2 or downward in the as FIG. 2. A magnetic field vector B is depicted in FIGS. 1 and 2 as an arrow or as a circle and dot using the normal convention for magnetic field vectors.

The structure depicted in the figures is thus a vertically injecting device and is sensitive to magnetic field vectors B oriented generally parallel to the substrate and perpendicular to the general direction of injection of carriers from the emitter.

Devices such as that depicted are constructed using relatively high resistivity substrate material, typically in the range of 100 ohm centimeters. A low resistivity of approximately 0.2 ohm centimeter P type doped base region 3 is first diffused in the substrate 1. The depth of the region is typically 50,000 Angstroms (5 microns) in preferred forms of the embodiment shown Separate base contacts 10 as shown in FIG. 2 are made at each end of the base region 3. Next, a shallow emitter region 2 is formed using a material of opposite type to that used in the base. As depicted, this region is heavily doped N type material approximately 5000 angstroms (0.5 microns) and it typically consists of arsenic doping if the base region 3 is doped to form a P type material The bottom surface of emitter 2 will be the dominant injecting region. This is assured by the heavily doped P+ type implant regions 4 shown in FIG. 1. The bottom surface of emitter 2 supplies minority carriers by injection into and conduction through the base to both base contact regions at opposite ends of the base channel 3.

The regions 4 shown in FIG. 1 prevent injection from occurring along the edges of emitter diffusion 2. These are preferred since, if the edges of emitter 2 were to contact the high resistivity region of the substrate 1, some excessive minority carrier injection could occur in a direction not perpendicular to the magnetic field. This would partially reduce the signal output and would also desensitize the magnetic diode structure by injecting carriers into the P-substrate region which would be shunted around the P+ base 3 and conducted out by the base contacts 10.

The vertically injected portion of the emitter current will be modulated by a Lorentz potential $V_L$ developed across the longest axis of the emitter-base junction A differential current and voltage will be experienced at the base contacts which obeys the following general relationship.

$$\Delta I_E = I_{Eo} \sinh(qV_L/Kt) \quad (1a)$$

$$\Delta E = I_{Eo} R_b \sinh(qV_I/Kt) \quad (1b)$$

Equation (1a) shows the differential current relationship and equation (1b) the differential voltage relation experienced at the output terminals. The value of $R_b$ is the resistance of the length of base material 3 between the emitter 2 and the base contacts 10.

The parameter $V_L$ defines the Lorentz injection modulation potential. The potential has been derived previously in my aforementioned copending application but is given again below:

$$V_L \max = \frac{VBW}{2KT/q} = \frac{W}{2L_n}(\mu_n B) \coth W_n/L_n \quad (2)$$

$$V_L \max = \frac{W}{2W_b}(\mu_n B) \text{ for } W_b/L_n < 1$$

$$V_L \max = \frac{W}{2L_n}(\mu_n B) \text{ for } W_b/L_n > 1$$

Where:
$\mu_n$ is the carrier mobility
B is magnetic field density
W is width of emitter region A fundamental expression for the differential current injected at the lower surface of the emitter 2 into the base region 3 of the differential diode structure shown in FIGS. 1 and 2 is given by expression 3 below.

$$\Delta I_e = I_{eo}(q/2kt)(VBW) \quad (3)$$

The above expression has been previously derived and has only been repeated here for convenience. An expression for the velocity V of the injected minority carriers is given as follows:

$$V = (D_n/L_n) \coth (W_b/L_n) = (KTq)(\mu_n/L_n)\coth (W_b/L_n) \quad (4)$$

By substituting equation (4) into equation (3), one can derive an expression for the change in emitter current.

$$\Delta I_e = I_{eo} W/L_n(\mu_n B/2) \coth W_b/L_n \quad (5)$$

For short base diodes in which the length Wb is less than a diffusion length Ln Equation (5) reduces to the following.

$$\Delta I_e = I_{eo} W/WB(\mu_n B/2) \quad (6)$$

For long base diodes where the base length Wb is greater than a diffusion length Ln, equation (5) reduces to another expression:

$$\Delta I_e = I_{eo} W/L_n(\mu_n B/2) \quad (7)$$

A differential output voltage can be measured between the base contacts 10 depending upon the resistivity of the base channels between the emitter surface and each base output contact, Rb. This is given by the following expression:

$$\Delta V = I_{eo} W/L_n(\mu_n B/2) R_b \coth W_b/L_n \quad (8)$$

Where:

-continued $R_b = \rho\, W_b/W\, T_b$
$\rho$ = resistivity of base channel
$W_b$ = base length
$W$ = emitter width
$T_b$ = depth of base channel The resistivity $\rho$ of the base channel in the area close to the emitter-base junction is determined primarily by the concentration of excess minority carriers injected into that region. As one approaches the vicinity of the base contact, the resistivity is determined as follows:

$$\rho = 1/Na q \mu p = 1/\sigma \quad (9)$$

Where:
$Na$ = acceptor concentration in base
$q$ = charge
$\mu p$ = hole mobility An estimate of the output voltage for a magnetic diode as shown in FIGS. 1 and 2 can be achieved by substituting the expression (9) into Equation (8). The result of this is as follows:

$$\Delta V = Ieo\, W_b/2Ln(\mu n/\mu p) B/Na q T_b\, \text{Coth}(W_b/L_n) \quad (10)$$

For short base length diodes, this reduces to the approximation given in expression (11):

$$\Delta V \simeq Ieo(\mu n/\mu p) B/(2\, Na q T_b) \quad (11)$$

For long base length diodes, the expression can be approximated as shown in Equation (12).

$$\Delta V \simeq IeO\, W_b/2Ln(\mu n/\mu p)\, B/Na q T_b \quad (12)$$

An expression can be derived for the voltage transduction efficiency $\Delta V/V$ which defines the ratio of magnetic signal sensitivity voltage to the quiescent DC diode voltage. The expression can be obtained directly from expression (8) by recognizing that $Ieo/2\, R_b$ will define the forward biased diode voltage drop. From expression (8) it can be found that:

$$\Delta V/V = W/Ln(\mu nB)\, \text{Coth}\, W_b/L_n \quad (13)$$

It is evident that the efficiency $\Delta V/V$ for a given magnetic field B will depend upon the minority carrier mobility $\mu_n$, the emitter width W and the base length $W_b$. From expression (13), it may be observed that the efficiency does not depend on the depth $T_b$ of the base region or on its impurity concentration Na. However, the magnitude of the response signal $\Delta V$ does depend on these parameters as shown by expression (12). As a result, long base diodes will produce the best signal to noise property It is most desirable to position the base contacts at least one minority carrier diffusion length $L_n$ away from the center of the emitter in order to minimize noise.

The sensitivity of a typical differential diode structure has been estimated assuming the following parameters and using the expression (8) above $Ieo = 20 \times 10^{-3}$ amps
$W/Ln\, \text{Coth}\, W_b/Ln = 1$
$R_b = 1000$
$\mu_{nB} = .9 \times 10^{-5}$
$W_b = 3 \times 10^{-3}$ Cm
$L_n = 2 \times 10^3$ Cm Utilizing the above assumptions the output voltage will be 0.09 millivolts per gauss. This sensitivity can be improved by increasing the base resistance, by operating at higher current levels, or both. A factor of five times approximate increase in sensitivity can be realized if the diode is constructed from P type gallium arsenide. This is true since the electron mobility $\mu$ for gallium arsenide is approximately five times that of the electron mobility in silicon which has been used in foregoing assumptions.

It is important to note that the use of load resistors $R_1$ greater in value than the base resistance of the diode structure should be employed. Otherwise, the signal voltage will be attenuated. It is preferred to energize the base contacts of the diode structure with current sources rather than resistors, but these facts would be evident to those of skill in the art.

Figure 3:
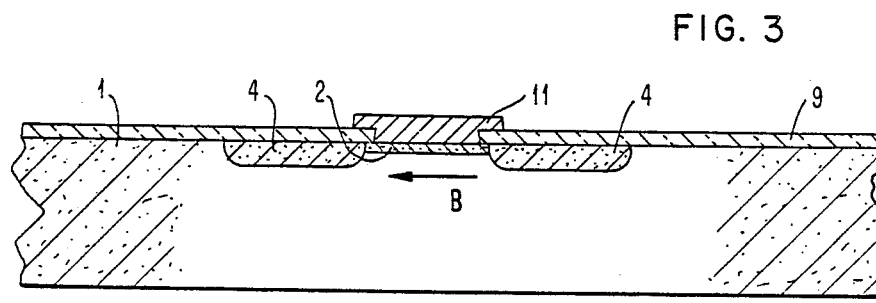
FIG. 3 is another cross-sectional view of the device shown in FIG. 1 taken at right angles to the cross-sectional view depicted in FIG. 2.

Returning briefly to the figures, FIG. 3 illustrates an alternative cross-section taken perpendicularly to the cross-section AA and indicated by the cross-section lines BB in FIG. 1. In FIG. 3, the P++ injection suppressors 4 are seen to bound the sides of the emitter 2 so that the only primary area of injection that remains is the bottom surface of emitter 2 as previously described.

Having thus described my invention with reference to a preferred embodiment thereof, what I desire to protect by Letters Patent is:

I claim:
1. A diode having an emitter and a base, an emitter contact and at least two base contacts;
    said base forming a PN junction at its interfaces with said emitter and having said base contacts and said emitter contacts supplied with electrical potential of proper polarity and magnitude to forward bias said PN junction to inject minority carriers from said emitter into said base and to withdraw such carriers at said base contacts;
    control means for defining at least one predominant area of injection from said emitter at said PN junction and for inhibiting injection at other areas of said PN junction; and
    said base contacts being positioned relative to said emitter to lie on opposite sides of an imaginary plane constructed perpendicular to said predominant area of injection from said emitter and bisecting the longest dimension thereof.
2. A diode as described in claim 1, wherein:
    said control means comprises a region of more highly doped material of the same conductivity type as that of said base, said material being in said base and surrounding said emitter except where said injection is desired.
3. A diode as described in claim 1, wherein:
    said base contacts are each positioned at least one minority carrier diffusion length away from the center of said emitter.

* * * * *